(12) United States Patent
Gao

(10) Patent No.: US 10,896,937 B2
(45) Date of Patent: Jan. 19, 2021

(54) DISPLAY DEVICES HAVING A LIGHT RECEIVING OPENING IN A DISPLAY REGION

(71) Applicant: Kunshan Go-Visionox Opto-Electronics Co., Ltd., Kunshan (CN)

(72) Inventor: Hanfei Gao, Kunshan (CN)

( * ) Notice: Subject to any disclaimer, the term of this patent is extended or adjusted under 35 U.S.C. 154(b) by 0 days.

(21) Appl. No.: 16/562,456

(22) Filed: Sep. 6, 2019

(65) Prior Publication Data
US 2019/0393280 A1 Dec. 26, 2019

Related U.S. Application Data

(63) Continuation of application No. PCT/CN2018/087157, filed on May 16, 2018.

(30) Foreign Application Priority Data

Sep. 30, 2017 (CN) .......................... 2017 1 0944079

(51) Int. Cl.
*G09G 3/32* (2016.01)
*H01L 27/32* (2006.01)
(Continued)

(52) U.S. Cl.
CPC ....... *H01L 27/3234* (2013.01); *G09G 3/3208* (2013.01); *H04N 5/2254* (2013.01); *H04N 5/2257* (2013.01); *H04M 1/0266* (2013.01)

(58) Field of Classification Search
CPC .......................... H01L 27/3234; H04N 5/2254; H04N 5/2257; G09G 3/3208
See application file for complete search history.

(56) References Cited

U.S. PATENT DOCUMENTS

| | | | | |
|---|---|---|---|---|
| 2010/0208128 A1* | 8/2010 | Yumiki | ................. | G03B 17/14 348/360 |
| 2015/0207908 A1 | 7/2015 | Hosoda | | |

(Continued)

FOREIGN PATENT DOCUMENTS

| | | |
|---|---|---|
| CN | 105446061 A | 3/2016 |
| CN | 105554200 A | 5/2016 |

(Continued)

OTHER PUBLICATIONS

CN First Office Action dated Sep. 25, 2019 in the corresponding CN application (application No. 201710944079.7).
(Continued)

*Primary Examiner* — Lisa S Landis
(74) *Attorney, Agent, or Firm* — Kilpatrick Townsend & Stockton, LLP

(57) ABSTRACT

The present application relates to a display device. The display device includes a body; a display screen disposed on the body. The display screen includes a first display region and a light transmissive region. The first display region has a light emitting surface facing away from the body, a light receiving module located between the display screen and the body, a second display region disposed between the display screen and the body, and the second display region is configured to compensate the light transmissive region to display image information in the light transmissive region; and a light path structure positioned between the display screen and the body.

14 Claims, 6 Drawing Sheets

(51) Int. Cl.
    *G09G 3/3208*     (2016.01)
    *H04N 5/225*     (2006.01)
    *H04M 1/02*     (2006.01)

(56) References Cited

U.S. PATENT DOCUMENTS

| | | | |
|---|---|---|---|
| 2017/0257559 A1 | 9/2017 | Stricker | |
| 2020/0160775 A1* | 5/2020 | Zhang | ................ H01L 27/3232 |

FOREIGN PATENT DOCUMENTS

| | | |
|---|---|---|
| CN | 106506742 A | 3/2017 |
| CN | 106790826 A | 5/2017 |
| CN | 106850897 A | 6/2017 |
| CN | 106920470 A | 7/2017 |
| CN | 107071242 A | 8/2017 |
| CN | 107071244 A | 8/2017 |
| CN | 107124488 A | 9/2017 |
| CN | 107172336 A | 9/2017 |
| JP | 2003091041 A | 3/2003 |
| TW | 201306587 A | 2/2013 |
| WO | 2018161750 A1 | 9/2018 |
| WO | 2019001136 A1 | 1/2019 |

OTHER PUBLICATIONS

International Search report dated Aug. 2, 2018 in the corresponding International application (application No. PCT/CN2018/087157).

* cited by examiner

DISPLAY DEVICES HAVING A LIGHT RECEIVING OPENING IN A DISPLAY REGION

CROSS REFERENCE TO RELATED APPLICATIONS

This application is a continue application for International Application PCT/CN2018/087157, filed on May 16, 2018, which claims the priority benefit of Chinese Patent Application No. 201710944079.7, titled "DISPLAY DEVICE" and filed on Sep. 30, 2017. The entireties of both applications are incorporated by reference herein for all purposes.

TECHNICAL FILED

The present disclosure relates to the field of display technologies.

BACKGROUND

In a conventional electronic product, a top portion of a display module is a non-display region. A light receiving module, such as a front camera, is placed under the non-display region, and external light is collected through an opening in the non-display region.

SUMMARY

Accordingly, it is necessary to provide a display device for a problem that a full screen display is difficult to realize in a conventional design.

A display device is provided in the present disclosure. The display device includes: a body; a display screen disposed on the body, the display screen including a first display region and a light transmissive region, the first display region having a light emitting surface facing away from the body; a light receiving module located between the display screen and the body; a second display region disposed between the display screen and the body, and the second display region is configured to compensate the light transmissive region to display image information in the light transmissive region; and a light path structure positioned between the display screen and the body. The second display region operates in a first state and a second state: operating in the first state, the second display region does not emit light, and light incident from the light transmissive region passes through the light path structure to reach the light receiving module; and operating in the second state, light emitted from the second display region passes through the light path structure to reach the light transmissive region, and the light transmissive region displays the image information.

According to the display device provided by the present disclosure, the second display region is provided between the display screen and the body, and the light emitted from the second display region passes through the light path structure to reach the light transmissive region, so as to achieve compensation for the light transmissive region. In this way, the light transmissive region displays the image information, and the full screen display is realized.

In one of the embodiments, a semi-reflective and semi-transparent structure and a reflective structure are configured on a path of the light path structure, and a reflective surface of the reflective structure faces toward the semi-reflective and semi-transparent structure; the semi-reflective and semi-transparent structure comprises a light transmissive surface and a reflective surface configured opposite to each other; when the second display region is in the first state, the light transmissive surface of the semi-reflective and semi-transparent structure faces the light transmissive region, and the reflective surface of the semi-reflective and semi-transparent structure and the reflective structure function together, and the light passing through the light transmissive surface reaches the light receiving module; when the second display region is in the second state, the reflective surface is flipped by 180 degrees with respect to a position of the light receiving module in the first state, and faces the light transmissive region and the second display region; the reflective surface reflects the light emitted from the second display region to the light transmissive region.

In one of the embodiments, a semi-reflective and semi-transparent structure are provided on a path of the light path structure; the semi-reflective and semi-transparent structure has a light transmissive surface and a reflective surface opposite to each other; when the second display region operates in the first state, the light transmissive surface of the semi-reflective and semi-transparent structure faces the light transmissive region, and the light incident from the light transmissive region passes through the light path structure to reach the light receiving module; when the second display region operates in the second state, the reflective surface is flipped by 180 degrees with respect to a position of the light receiving module when the second display region is in the first state, and faces the light transmissive region and the second display region; the reflective surface reflects the light emitted from the second display region to the light transmissive region.

In one of the embodiments, the semi-reflective and semi-transparent structure includes a transparent substrate and a semi-reflective and semi-transparent film covering a surface of the transparent substrate; a surface of one side of the transparent substrate forms the reflective surface, and a surface of another side of the transparent substrate forms the light transmissive surface allowing the light to pass through the transparent substrate.

In one of the embodiments, when the second display region operates in the second state, a projection of the reflective surface on the display screen covers the light transmissive region, and a projection of the reflective surface on the second display region covers the second display region.

In one of the embodiments, the semi-reflective and semi-transparent structure is located between the second display region and the light receiving module; the semi-reflective and semi-transparent structure is configured at an inclination of 45 degrees, and the second display region is configured vertically.

In one of the embodiments, the display device further includes a driving mechanism controlling a flipping of the semi-reflective and semi-transparent structure, and an execution control module, or called as a execution control circuit, controlling the driving mechanism.

In one of the embodiments, the light receiving module comprises a camera; a lens axis of the camera is parallel to the display screen, and the second display region is perpendicular to the lens axis of the light receiving module and the display screen at a same time; when the second display region is in the second state, an included angle between the reflective surface and the lens axis of the camera is 45 degrees.

In one of the embodiments, the second display region is an OLED display screen; the light emitting surface of the second display region faces toward the light path structure, and the second display region is located on a side of the display screen and is accommodated inside the body.

In one of the embodiments, the second display region comprises an OLED display screen with a bottom light emitting structure, and the second display region extends toward the body after being bent 90 degrees from an end portion of the second display region; a bent end portion of the second display region is positioned at a side of the light transmissive region, and a remaining portion of the second display region except the end portion of the second display region is accommodated inside the body.

In one of the embodiments, the second display region is an OLED display screen with a top light emitting structure, and all of the second display region is accommodated inside the body.

In one of the embodiments, the body is provided with a receiving cavity, and the light path structure and the light receiving module are located inside the receiving cavity.

In one of the embodiments, the light transmissive region is a through hole, and a condensing lens is mounted in the through hole.

In one of the embodiments, the light transmissive region is disposed close to an edge of the display screen.

DETAILED DESCRIPTION OF THE EMBODIMENTS

As explained above, displays usually include display areas and non-display areas. This arrangement results in a large black frame on a screen. A region corresponding to the light receiving module cannot be used for display, and it is difficult to achieve full screen display.

Reference will be made to the drawings to describe embodiments of the present disclosure in detail, so that the above objects, features and advantages of the present disclosure can be more apparent and understandable. In the follow description, numerous specific details are set forth in order to facilitate a thorough understanding of the disclosure. However, the present disclosure can be implemented in many other ways different from those described herein, and those skilled in the art can make similar modifications without departing from the disclosure, and therefore, the present disclosure is not limited by the specific embodiments disclosed below.

It should be understood that when an element is referred to as being "fixed to" another element, it is either directly on an element or indirectly on an element with a mediating element. When an element is referred to as being "connected" or "coupled" to another element, it can be directly connected or coupled to another element or indirectly connected coupled to another element with an mediating element.

All technical and scientific terms used herein have the same meaning as commonly understood by one of ordinary skill in the art to which the present disclosure belongs, unless otherwise defined. The terms used herein are for the purpose of describing specific embodiments only and are not intended to limit the present disclosure. As used herein, the term "and/or" includes any and all combinations of one or more of the associated listed items.

Figure 1:
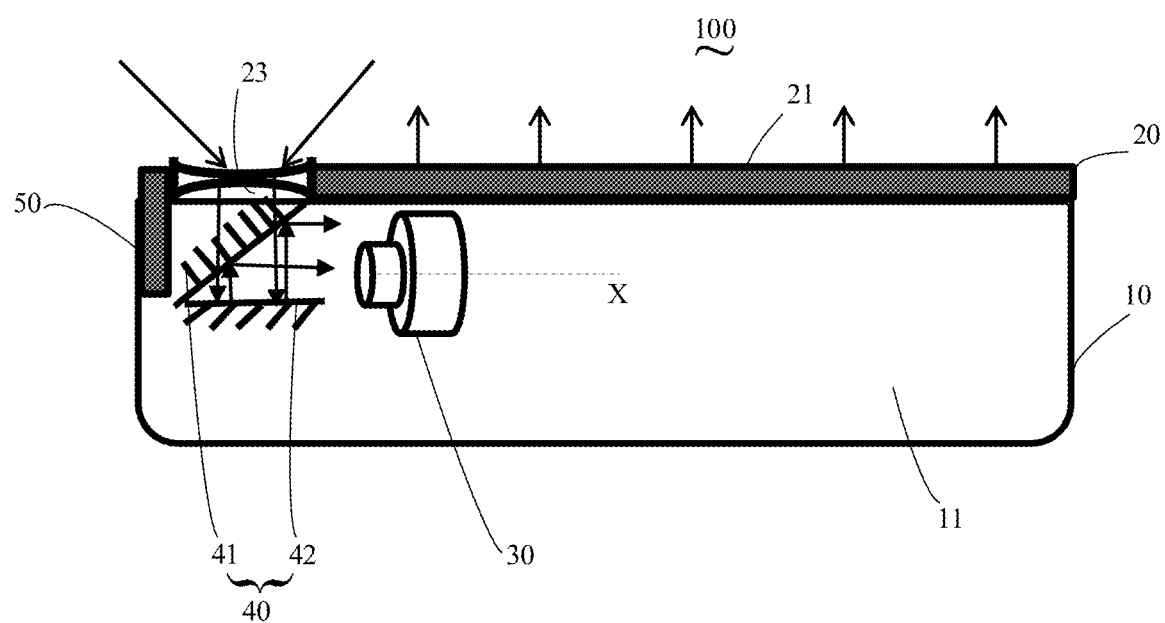
FIG. 1 is a side view of a display device according to an embodiment of the present disclosure.
Figure 2:
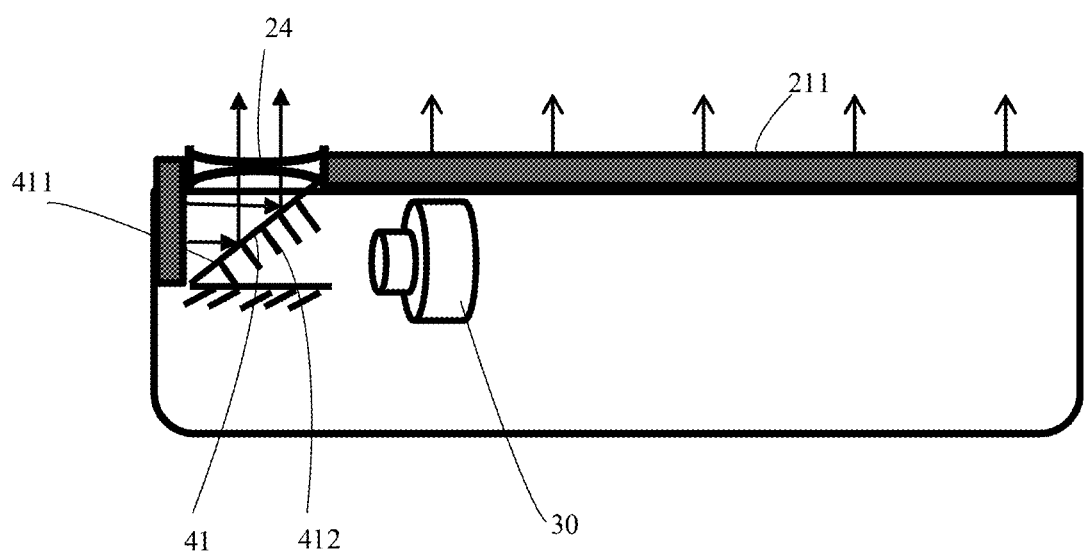
FIG. 2 is a side view of a display device according to an embodiment of the present disclosure, illustrating a principle of realizing full screen display when a second display region is in a second state.

According to an embodiment of the present disclosure, a display device 100 that is capable of realizing the full screen display is provided. As shown in FIG. 1 and FIG. 2, the display device 100 includes a body 10, a display screen 20, a light receiving module 30, a light path structure 40, and a second display region 50. The display screen 20 is disposed on the body 10, and the display screen 20 includes a first display region 21 and a light transmissive region 23. The first display region 21 has a light emitting surface 211 facing away from the body 10, and the light receiving module 30 is located between the display screen 20 and the body 10. The light path structure 40 and the second display region 50 are disposed between the display screen 20 and the body 10. The first display region 21 can be a conventional display region. The second display region 50 has a first state as shown in FIG. 1 and a second state as shown in FIG. 2. In the first state, the second display region 50 does not emit light, and light incident from the light transmissive region 23 passes through the light path structure 40 to reach the light receiving module 30. Specifically, the light incident from the light transmissive region 23 passes through the light path structure 40 to reach the light receiving module 30 or is reflected by the light path structure 40 to the light receiving module 30. In the second state, the light emitted from the second display region 50 is reflected by the light path structure 40 to the light transmissive region 23, so that the light transmissive region 23 displays image information, thereby realizing the full screen display. In addition, the second display region 50 switches an operating state according to a received control command, thereby switching to a full screen display mode according to actual needs.

The display screen 20 is used as a display screen in the display device 100. Only the light transmission region 23 is required to be reserved in the display screen, and other regions can be provided as a conventional display region, such that an area of the display screen is substantially equal to an area of an upper surface of the body 10. Thereby, a display device having a high screen share ratio is provided.

In an embodiment, a semi-reflective and semi-transparent structure 41 and a reflective structure 42 is provided on a path of a light path structure 40. The semi-reflective and semi-transparent structure 41 has a reflective surface 411 and a light transmissive surface 412 opposite to each other.

On one hand, when the second display region 50 is in the first state, the light transmissive surface 412 of the semi-reflective and semi-transparent structure 41 faces the light transmissive region 23, and the reflective surface 411 of the semi-reflective and semi-transparent structure 41 and the reflective structure 42 function together, so that the light passing through the light transmissive surface 412 reaches the light receiving module 30. Specifically, referring to FIG. 1 and FIG. 2, the light incident from the light transmissive region 23 passes through the semi-reflective and semi-transparent structure 41 and then is firstly reflected by the reflective structure 42 to the reflective surface 411, and then reflected by the reflective surface 411 to the light receiving module 30.

On the other hand, when the second display region 50 is in the second state, the reflective surface 411 is flipped by 180 degrees with respect to a position of the reflective surface 411 when the second display region is in the first state, and faces the light transmissive region 23 and the second display region 50. In this case, the light reflective surface 411 reflects the light emitted from the second display region 50 to the light transmissive region 23.

In this embodiment, a requirement of light transmission and reflection is achieved by a flipping of the semi-reflective and semi-transparent structure 41. A light receiving effect of the light receiving module 30 can be ensured, as long as the reflection structure 42 is provided. In addition, when the reflective structure 42 is provided, the light passing through the semi-reflective and semi-transparent structure 41 from the light transmissive region 23 is reflected twice to reach the light receiving module 30. When the light receiving module 30 is a camera, an included angle between a lens axis X of the camera and the reflective surface 411 can be an acute angle. In this case, the light receiving effect of the light receiving module 30 can be ensured.

The lens axis X of the light receiving module 30 and the reflective surface 411 are not required to be perpendicular, and the light receiving effect can also be ensured, thereby providing more possibilities for an arrangement of the light receiving module 30. For example, in an embodiment, the lens axis X of the light receiving module 30 is parallel to the display screen 20, the reflective structure 42 is also parallel to the display screen 20. When the second display region 50 is in the second state, an included angle between the semi-reflective and semi-transparent surface 411 and the axis X of the light receiving module 30 is 45 degrees, and the reflective structure 42 is required to be disposed at only one place, and the structure is simple.

In an embodiment, the path of the light path structure 40 can also be provided with only the semi-reflective and semi-transparent structure 41. When the second display region 50 is in the first state, the light transmissive surface 412 of the semi-reflective and semi-transparent structure 41 faces the light transmissive region 23, and the light incident from the light transmissive region 23 passes through the semi-reflective and semi-transparent structure 41 to reach the light receiving module 30. When the second display region 50 is in the second state, the reflective surface 411 is flipped by 180 degrees with respect to a position of the light receiving module 30 when the second display region 50 is in the first state, and faces the light transmissive region 23 and the second display region 50. The reflective surface 411 reflects light emitted from the second display region 50 to the light transmissive region 23.

In an embodiment, when the light path structure 40 includes only the semi-reflective and semi-transparent structure 41, the lens axis X of the light receiving module 30 can be perpendicular to the reflective surface 411, so as to sufficiently receive the light passing through the semi-reflective and semi-transparent structure 41. In other embodiments, an included angle between the lens axis X of the light receiving module 30 and the reflective surface 411 can also an acute angle.

Only the semi-reflective and semi-transparent structure 41 is used on the light path structure 40. In this way, through the flipping of the semi-reflective and semi-transparent structure 41, not only the light from the light transmissive region 23 can be reflected to the light receiving module 30, but also the light from the second display region 50 can be reflected to the light transmissive region 23, and a structure of the light path structure 40 is very simple.

Figure 3:
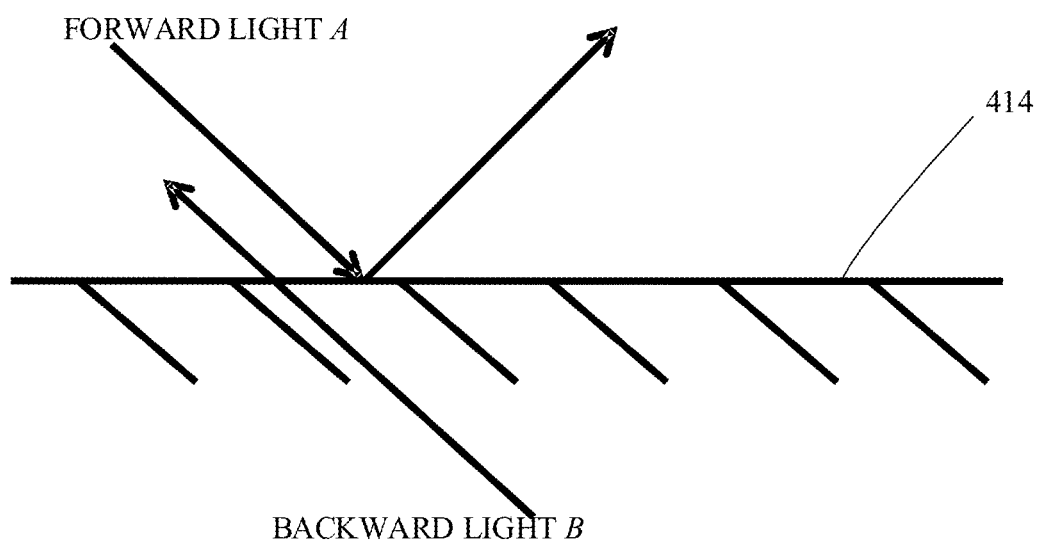
FIG. 3 is a schematic view illustrating a working principle of a semi-reflective and semi-transparent film.

In an embodiment, the semi-reflective and semi-transparent structure 41 includes a transparent substrate 413 and a semi-reflective and semi-transparent film 414 covering a surface of the transparent substrate 413. A working principle of the semi-reflective and semi-transparent film 414 can be referred to FIG. 3, and a forward light A can be reflected by the semi-reflective and semi-transparent film 414, and cannot pass through the semi-reflective and semi-transparent film 414, and a backward light B can pass through the semi-reflective and semi-transparent film 414.

Therefore, when the semi-reflective and semi-transparent film 414 is disposed on a surface of the transparent substrate 413, a surface of one side of the transparent substrate 413 forms the reflective surface 411 opposite to the light transmissive region and the lens of the light receiving module. A surface of another side of the transparent substrate 413 forms the light transmissive surface 412 allowing the light to pass through the transparent substrate 413.

The semi-reflective and semi-transparent structure 41 can be obtained by coating the transparent substrate 413 with the semi-reflective and semi-transparent film 414. The structure thereof is simple, and a manner in which a film layer is disposed on a carrier is easy to implement in a process. Specifically, the transparent substrate 413 can be made of transparent glass, which can be easily obtained and processed without special manufacturing. In this way, a preparation work is simplified, and it is beneficial for improving manufacturing efficiency.

In an embodiment, a projection of the reflective surface 411 on the display screen 20 covers the light transmissive region 23, and a projection of the reflective surface 411 on the second display region 50 covers the second display region 50.

When the second display region 50 is in the first state, and the light is incident from the light transmissive region 23, the incident light can all illuminate on the reflective surface 411, and the reflective surface 411 reflects the light to the light receiving module 30. Thereby, the light receiving effect of the light receiving module 30 is ensured. When the second display region 50 is in the second state, a reflection effect on the light emitted from the second display region 50 can be ensured, thereby ensuring a full screen display effect.

Figure 5:
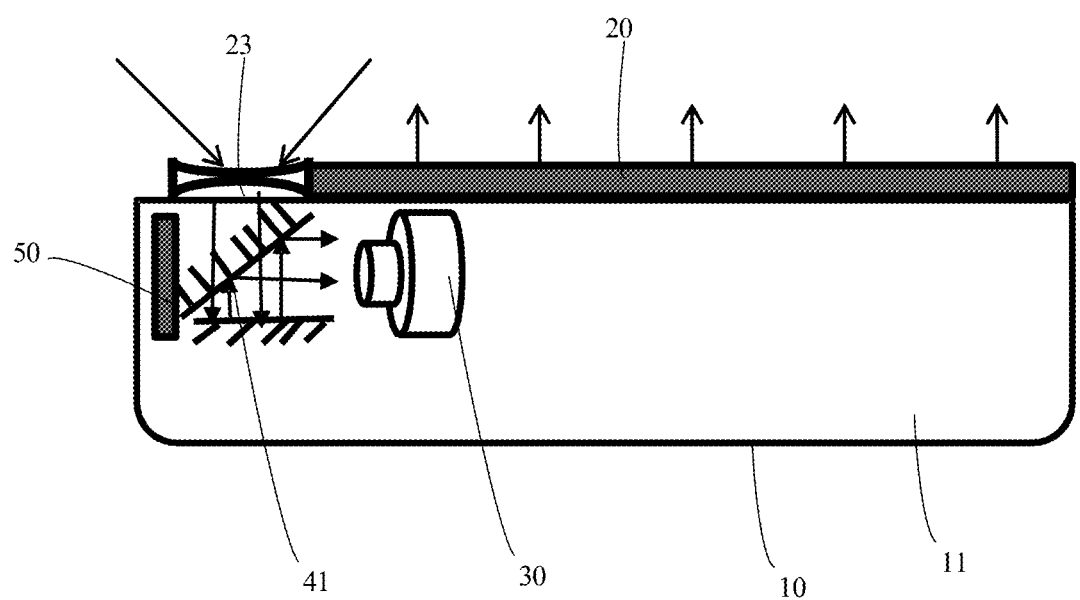
FIG. 5 is a side view of a display device according to another embodiment of the present disclosure.
Figure 6:
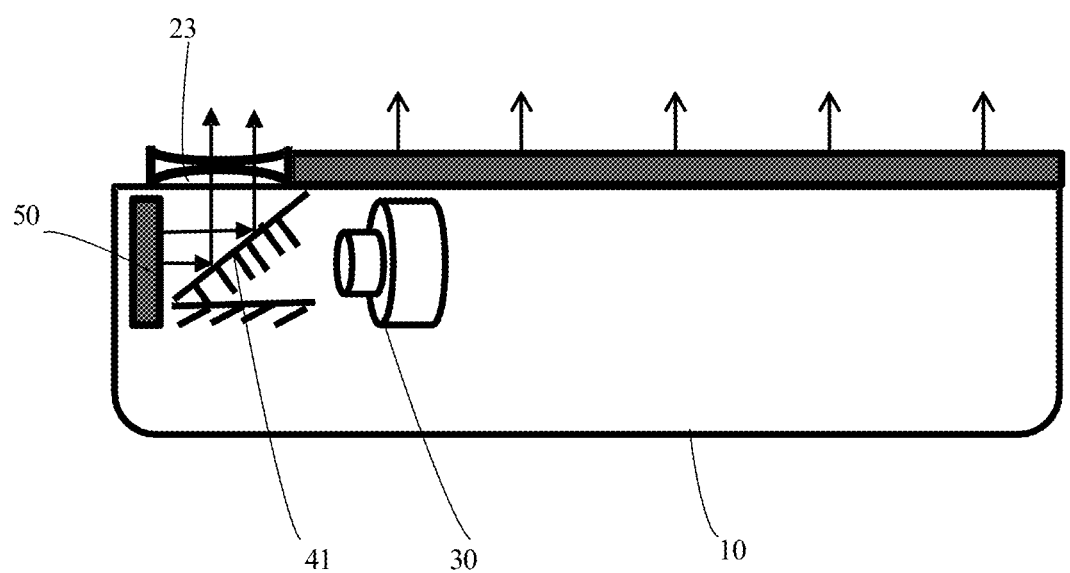
FIG. 6 is a side view of a display device according to another embodiment of the present disclosure, illustrating the principle of realizing full screen display when the second display region is in the first state.

In an embodiment, the semi-reflective and semi-transparent structure 41 is located between the second display region 50 and the light receiving module 30. As shown in FIGS. 5 and 6, the semi-reflective and semi-transparent structure 41 is placed at an inclination of 45 degrees and the second display region 50 is placed vertically. The projection of the reflective surface 411 on the second display region 50 covers the second display region 50. The projection of the reflective surface 411 on the display screen 20 also covers the light transmissive region 23, thereby ensuring no light leakage and ensuring reflection effects.

In an embodiment, the light receiving module 30 is the camera, the lens axis X of the camera is parallel to the display screen 20, and the second display region 50 is perpendicular to the lens axis X of the light receiving module 30 and the display screen 20 at the same time. When the second display region 50 is in the second state, the included angle between the reflective surface 411 and the lens axis X of the light receiving module is 45 degrees. In this case, when the second display region 50 is in the second state, and the light receiving module 30 is deactivated, the light emitted from the second display region 50 to the reflective surface 411 is reflected to the light transmissive region 23 at a 90 degrees reflection angle. That is, when the light reaches the light transmission region 23, the light is perpendicular to the display screen 20, so that the display mode of the light transmission region 23 is consistent with the display mode of the first display region 21, and an overall visual effect of the full screen display is improved.

As shown in FIG. 6, the light emitted from the second display region 50 to the reflective surface 411 is horizontally right directed, and is reflected by the reflective surface 411 and then directed vertically upward toward the light transmissive region 23.

Figure 4:
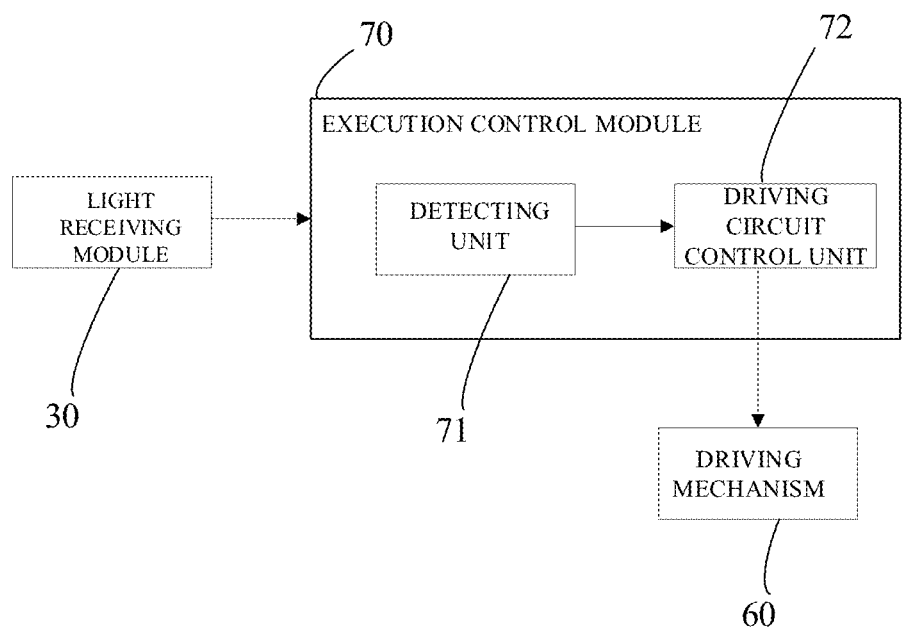
FIG. 4 is a block diagram of an execution control module, a driving mechanism, and a light receiving module of a display device according to an embodiment of the disclosure.

In an embodiment, as shown in FIG. 4, the display device 100 further includes a driving mechanism 60 controlling a flipping of the semi-reflective and semi-transparent structure 41, and an execution control module 70 controlling the driving mechanism 60.

In an embodiment, the execution control module 70 controls an operation of the driving mechanism 60 according to an operation or shutdown signal of the light receiving module 30. By providing the driving mechanism 60, the semi-reflective and semi-transparent structure 41 is automatically flipped according to an operating situation of the light receiving module 30, so that the display device 100 can automatically switch to the full screen display when the light receiving module 30 is not operating.

In an embodiment, a servo motor and a flip pedal can be employed in the drive mechanism 60. The execution control module 70 realizes the flipping of the semi-reflective and semi-transparent structure 41 by controlling a forward rotation and a reverse rotation of an output shaft of the servo motor. Furthermore, the execution control module 70 controls an accuracy of the flipping of the semi-reflective and semi-transparent structure 41 by controlling the number of turns of the output shaft of the servo motor.

In an embodiment, the second display region 50 is an OLED (Organic Electroluminescence Display) display screen, that is, an organic electroluminescence display screen. The OLED display screen has an advantage of self-luminous characteristic, high brightness, and good display effect, etc.

In an embodiment, the first display region 21 of the display screen 20 is an OLED display screen that emits light at one side. The light emitting surface of the second display region 50 faces the light path structure 40.

In an embodiment, as shown in FIGS. 5 and 6, the second display region 50 is an OLED display screen of a bottom light emitting type. In this situation, an end portion of the second display region 50 is located at a side of the light transmissive region 23, and a remaining portion of the second display region 50 except the end portion is accommodated inside a receiving cavity 11 of the body 10. Furthermore, the OLED display screen of the bottom light emitting type can be disposed such that an end portion thereof is aligned with the first display region 21, thereby ensuring a display effect of the connecting region, and then bending 90 degrees, that is, an bent end portion of the second display region 50 is located on a side of the light transmissive region 23, and the remaining portion of the second display region 50 is accommodated inside the receiving cavity 11 of the body 10.

A thickness of the OLED display screen is very small. In this case, although the end portion of the second display region 50 extends to one side of the light transmissive region 23, for an entire display screen of the display device 100, the thickness thereof is negligible. The entire display screen of the display device 100 provided by embodiments of the present disclosure still exhibits a full screen effect compared to a conventional display device that a large black edge must be provided around the display screen.

In an embodiment, as shown in FIGS. 5 and 6, when the second display region 50 is an OLED display screen with a top light emitting structure, the light emitting surface of the second display region 50 faces the light path structure 40. In this way, the second display region 50 is entirely located on one side of the display screen, and the second display region 50 is entirely accommodated in the receiving cavity 11 of the body 10, so as not to affect the thickness and aesthetics of the device.

In an embodiment, the second display region 50 is not limited to an OLED display screen, and can be other types of display screens, such as a liquid crystal display screen, a Micro-LED, a CRT, or a plasma screen, etc.

As shown in FIG. 5, when the second display region 50 is in the first state, the second display region does not emit light, and the light passing through the semi-reflective and semi-transparent structure 41 is reflected to the light receiving module 30. As shown in FIG. 6, when the second display region 50 is in the second state, the semi-reflective and semi-transparent structure 41 is flipped by 180 degrees. The second display region 50 emits light, and the light emitted from the second display region 50 is reflected by the semi-reflective and semi-transparent structure 41 to the light transmissive region 23, so as to achieve compensation for the light transmissive region 23. In this way, the light transmissive region 23 displays the image information, and the full screen display is realized.

In an embodiment, the light path structure 40, the light receiving module 30, and the second display region 50 can also be disposed to be located inside the receiving cavity 11, so as not to affect the thickness and aesthetics of the device.

The display device 100 provided in the embodiments of the present disclosure can be a mobile phone, a computer, a television, or the like. In an embodiment, the body 10 can be a housing for a mobile terminal, such as a mobile phone, and the display screen 20 is mounted on the body to form a front structure of the mobile phone. In other embodiments, the body 10 can be a host housing of other display devices, for example, the body 10 is a host housing of a tablet computer.

In an embodiment, the light transmissive region 23 is a through hole, and a condensing lens 24 is mounted in the through hole. Since the condensing lens 24 is provided, the light receiving effect of the light receiving module 30 is improved, and the imaging effect can be ensured.

In addition, in various embodiments of the present invention, a position of the light transmissive region 23 on the display screen 20 is not specifically limited. Generally, the light transmissive region 23 is disposed close to an edge of the display screen 20, so as not to affect a display effect of the first display region 21.

In an embodiment, the second display region 50 switches the operating state according to the activation or deactivation of the light receiving module 30, thereby realizing an automatic switching to the full screen display mode according to the operation situation of the light receiving module 30.

In an embodiment, the display device 100 includes the execution control module 70. The execution control module 70 includes a detecting unit 71 and a driving circuit control unit 72. The detecting unit 71 is used to detect whether the light receiving module 30 is activated in real time, and the driving circuit control unit 72 is used to control the second display region 50 to be in the operating state or in an non-operating state according to the driving signal of the light receiving module 30. When the light receiving module 70 is deactivated, the driving circuit control unit 72 controls the second display region 50 to emit light for displaying. When the light receiving module 30 is activated, the driving circuit control unit 72 controls the second display region 50 to stop displaying. Through providing the execution of the control module 70, when the light receiving module 30 is deactivated, the second display region 50 emits light and compensates for the light transmissive region 23, thereby realizing the full screen display.

In an embodiment, when the light receiving module 30 is activated, the driving circuit control unit 72 turns off power supply to the second display region 50. When the light receiving module 30 is deactivated, the driving circuit control unit 72 resumes the power supply to the second display region 50.

In an embodiment, when the light receiving module 30 is activated, the driving circuit control unit 72 turns off a data line corresponding to the second display region 50 in a scan row, so that the second display region 50 stops displaying an associated application. When the light receiving module 30 is deactivated, the driving circuit control unit 72 turns on the data line corresponding to the second display region 50 in the scan row, so that the second display region 50 displays the associated application. When the second display region 50 displays the associated application, a viewer can see a displayed image.

Each of the technical features of the forgoing embodiments may be combined arbitrarily. In order to simplify the description, not all the possible combinations of each of the technical features in the above embodiments are described. However, all of the combinations of these technical features should be considered as within the scope of the present specification, as long as such combinations do not contradict with each other.

Although the disclosure is illustrated and described herein with reference to specific and detailed embodiments, the disclosure is not intended to be limited to the details shown. It should be noted that any variation or replacement readily figured out by persons skilled in the art within the technical scope disclosed in the present disclosure shall all fall within the protection scope of the present disclosure. Therefore, the scope of the present disclosure shall be defined by the appended claims.

The invention claimed is:

1. A display device, comprising:
   a body;
   a display screen disposed on the body, the display screen comprising a first display region and a light transmissive region, the first display region having a light emitting surface facing away from the body;
   a light receiving module located between the display screen and the body;
   a second display region disposed between the display screen and the body, the second display region being configured to compensate the light transmissive region to display image information in the light transmissive region; and
   a light path structure positioned between the display screen and the body;
   wherein the second display region operates in a first state and a second state: operating in the first state, the second display region does not emit light, and light incident from the light transmissive region passes through the light path structure to reach the light receiving module; and operating in the second state, light emitted from the second display region passes through the light path structure to reach the light transmissive region, and the light transmissive region displays the image information.

2. The display device of claim 1, wherein a semi-reflective and semi-transparent structure and a reflective structure are configured on a path of the light path structure, and a reflective surface of the reflective structure faces toward the semi-reflective and semi-transparent structure; the semi-reflective and semi-transparent structure comprises a light transmissive surface and a reflective surface configured opposite to each other;
   when the second display region is in the first state, the light transmissive surface of the semi-reflective and semi-transparent structure faces the light transmissive region, and the reflective surface of the semi-reflective and semi-transparent structure and the reflective structure action together, and the light passing through the light transmissive surface reaches the light receiving module;
   when the second display region is in the second state, the reflective surface is flipped by 180 degrees with respect to a position of the light receiving module when the second display region is in the first state, and faces the light transmissive region and the second display region; the reflective surface reflects the light emitted from the second display region to the light transmissive region.

3. The display device of claim 1, wherein a semi-reflective and semi-transparent structure are provided on a path of the light path structure; the semi-reflective and semi-transparent structure has a light transmissive surface and a reflective surface opposite to each other;
   when the second display region operates in the first state, the light transmissive surface of the semi-reflective and semi-transparent structure faces the light transmissive region, and the light incident from the light transmissive region passes through the light path structure to reach the light receiving module;
   when the second display region operates in the second state, the reflective surface of the semi-reflective and semi-transparent structure is flipped by 180 degrees with respect to a position of the light receiving module when the second display region is in the first state, and faces the light transmissive region and the second display region; the reflective surface reflects the light emitted from the second display region to the light transmissive region.

4. The display device of claim 2, wherein the semi-reflective and semi-transparent structure comprises a transparent substrate and a semi-reflective and semi-transparent film covering a surface of the transparent substrate; a surface of one side of the transparent substrate forms the reflective surface, and a surface of another side of the transparent substrate forms the light transmissive surface allowing the light to pass through the transparent substrate.

5. The display device of claim 2, wherein when the second display region operates in the second state, a projection of the reflective surface on the display screen covers the light transmissive region, and a projection of the reflective surface on the second display region covers the second display region.

6. The display device of claim 5, wherein the semi-reflective and semi-transparent structure is located between the second display region and the light receiving module; the semi-reflective and semi-transparent structure is configured at an inclination of 45 degrees, and the second display region is configured vertically.

7. The display device of claim 2 further comprising a driving mechanism controlling a flipping of the semi-reflective and semi-transparent structure.

8. The display device of claim 2, wherein:
the light receiving module comprises a camera,
a lens axis of the camera is parallel to the display screen, and
the second display region is perpendicular to the lens axis of the camera and the display screen at a same time;
when the second display region is in the second state, an included angle between the reflective surface and the lens axis of the camera is 45 degrees.

9. The display device of claim 1, wherein the second display region is an OLED display screen; the light emitting surface of the second display region faces toward the light path structure, and the second display region is located on a side of the display screen and is accommodated inside the body.

10. The display device of claim 9, wherein the second display region comprises an OLED display screen having a bottom light emitting structure, and the second display region extends toward the body after being bent 90 degrees from an end portion of the second display region; a bent end portion of the second display region is positioned at a side of the light transmissive region, and a remaining portion of the second display region except the end portion of the second display region is accommodated inside the body.

11. The display device of claim 9, wherein the second display region is an OLED display screen with a top light emitting structure, and all of the second display region is accommodated inside the body.

12. The display device of claim 1, wherein the body is provided with a receiving cavity, and the light path structure and the light receiving module are located inside the receiving cavity.

13. The display device of claim 1, wherein the light transmissive region is formed as a through hole, and a condensing lens is mounted in the through hole.

14. The display device of claim 1, wherein the light transmissive region is disposed close to an edge of the display screen.

* * * * *